United States Patent [19]

Ahmed et al.

[11] Patent Number: 5,342,694
[45] Date of Patent: Aug. 30, 1994

US005342694A

[54] TREATING AN AUTODEPOSITED COATING WITH AN ALKALINE MATERIAL

[75] Inventors: Bashire M. Ahmed, Ambler; Ronald W. Broadbent, Ardsley, both of Pa.

[73] Assignee: Henkel Corporation, Plymouth Meeting, Pa.

[21] Appl. No.: 202,117

[22] Filed: Jun. 3, 1988

Related U.S. Application Data

[63] Continuation-in-part of Ser. No. 144,467, Jan. 15, 1988, abandoned, which is a continuation-in-part of Ser. No. 910,355, Sep. 22, 1986, abandoned, which is a continuation of Ser. No. 635,968, Jul. 31, 1984, abandoned, which is a continuation-in-part of Ser. No. 517,133, Jul. 25, 1983, abandoned, and a continuation-in-part of Ser. No. 629,924, Jul. 11, 1984, Pat. No. 4,562,098.

[51] Int. Cl.$^5$ .................. B32B 15/08; B05D 3/04
[52] U.S. Cl. .................. 428/461; 427/335; 427/340; 427/341; 427/443.1; 428/463
[58] Field of Search .............. 427/435, 443.1, 340, 427/341, 353, 378, 379, 388.40, 430.1, 341, 435, 443.1, 340; 148/6.14 R

[56] References Cited

U.S. PATENT DOCUMENTS

| | | | |
|---|---|---|---|
| 2,850,415 | 9/1958 | Harrison | 427/377 X |
| 2,882,189 | 4/1959 | Russell et al. | 427/377 X |
| 2,973,285 | 2/1961 | Berke et al. | 427/341 |
| 3,450,577 | 6/1969 | Beach | 427/377 X |
| 3,647,567 | 3/1972 | Schweri | 427/341 X |
| 3,700,505 | 10/1972 | Kanter | 427/377 X |
| 3,709,743 | 1/1973 | Dalton et al. | 148/6.2 |
| 3,874,898 | 4/1975 | McInnes et al. | 427/341 |
| 3,922,403 | 11/1975 | Sample, Jr. et al. | 427/340 |
| 3,960,610 | 6/1976 | Steinbrecher et al. | 427/377 X |
| 4,160,047 | 7/1979 | Saridakis | 427/435 X |
| 4,162,348 | 7/1979 | Juzu et al. | 427/435 X |
| 4,178,400 | 12/1979 | Lochel, Jr. | 427/435 |
| 4,218,498 | 8/1980 | Cohen | 427/340 |
| 4,297,948 | 7/1981 | Kukanskis et al. | 427/443.1 X |
| 4,343,839 | 8/1982 | Blegen | 427/340 |
| 4,357,372 | 11/1982 | Leister et al. | 427/345 |
| 4,379,188 | 4/1983 | Zimmerman et al. | 427/341 |
| 4,655,833 | 4/1987 | Amelio et al. | 427/443.1 X |
| 4,758,621 | 7/1988 | Broadbent | 427/435 X |

*Primary Examiner*—Thurman K. Page
*Assistant Examiner*—Neil Levy
*Attorney, Agent, or Firm*—Ernest G. Szoke; Wayne C. Jaeschke; Alexis Barron

[57] ABSTRACT

Properties of cured autodeposited coatings are improved by contacting the uncured form of the autodeposited coating with an alkaline material, for example, with an aqueous solution of ammonium bicarbonate, or a hydroxide of an alkali metal or ammonia.

39 Claims, No Drawings

TREATING AN AUTODEPOSITED COATING WITH AN ALKALINE MATERIAL

CROSS-REFERENCE TO RELATED APPLICATIONS

This is a continuation-in-part of application Ser. No. 144,467, filed Jan. 15, 1988, (now abandoned) which is a continuation-in-part of Ser. No. 910,355, filed Sep. 22, 1986, (now abandoned) which is a continuation of Ser. No. 635,968, filed Jul. 31, 1984 (now abandoned), which is a continuation-in-part of application Ser. No. 517,133, filed Jul. 25, 1983 (now abandoned) and a continuation-in-part of application Ser. No. 629,924, filed Jul. 11, 1984, now U.S. Pat. No. 4,562,098.

FIELD OF THE INVENTION

This invention relates to the formation of resinous coatings on metallic surfaces. More specifically, this invention relates to means for improving properties of resinous coatings of the type formed from autodepositing compositions.

Autodeposition involves the use of an aqueous resinous coating composition of low solids concentration (usually less than about 10%) to form a coating of high solids concentration (usually greater than about 10%) on a metallic surface immersed therein, with the coating increasing in thickness or weight the longer the time the metallic surface is immersed in the composition. Autodeposition is similar to electrodeposition but does not require the aid of external electrical current to cause the resin particles to deposit on the metal surface. In general, autodepositing compositions are aqueous acid solutions having solid resin particles dispersed therein.

Autodepositing compositions can be used to form coatings which have good aesthetic properties and which protect the underlying metallic substrate from being degraded (for example, corroded by water). However, there are certain applications which require that the autodeposited coating have particularly good properties for satisfactory use. Various means have been developed to improve the properties of autodeposited coatings, including, for example: chemical pretreatment of the metallic surface prior to formation of the coating; selection of particular resins for use in forming the coating; addition to the autodepositing composition of chemical additives; and chemical treatment of the freshly formed or uncured coating.

The present invention relates to the chemical treatment of an uncured autodeposited coating for the purpose of improving various properties thereof, including, for example, rendering the coating more impermeable to fluids, for example, water.

REPORTED DEVELOPMENTS

Various chemical treatments of uncured autodeposited coatings for the purpose of improving the properties of the cured coatings have been reported.

There are several U.S. patents which disclose the treatment of freshly formed autodeposited coatings with acidic aqueous solutions of one or more chromium compounds to improve the corrosion-resistance and/or surface appearance of the cured coating. Among such patents are U.S. Pat. Nos: 3,795,546; 4,030,945; 4,411,950; and 4,637,839, all assigned to the same assignee as that of the present invention. The '546 and '945 patents disclose treating an uncured autodeposited coating with an acidic aqueous solution containing hexavalent chromium or hexavalent chromium and formaldehyde-reduced forms of hexavalent chromium to improve the corrosion-resistant properties of the cured form of the coating and to reduce the gloss of an otherwise glossy coating. According to these patents, the source of chromium can be chromium trioxide or water-soluble salts of chromium or dichromate, for example, sodium, potassium, and lithium salts thereof. Optional ingredients of such chromium-containing solutions include phosphoric acid (anti-gelling agent), sodium hydroxide (pH adjuster), and a water-soluble or water-dispersible polyacrylic acid (corrosion-resistant and paint-bonder improver). The '950 patent discloses the treatment of an uncured autodeposited coating with an aqueous chromium-containing solution which has dispersed therein particles of a resin which functions to impart to the cured form of the coating a reduced coefficient of friction. The patent discloses that the function of the chromium is to improve the corrosion-resistant properties of the cured coating, and the function of the resin, for example, polytetrafluoroethylene, is to increase the surface slip of the cured form of the coating. The '839 patent discloses the treatment of an uncured autodeposited coating with an acidic aqueous treating solution prepared by admixing a hexavalent chromium-containing compound (for example, ammonium and an alkali metal dichromate) with a hexavalent chromium/reduced chromium solution. In addition, the treating solution contains an acid or salt thereof, for example, hydrochloric acid, nitric acid, sulfuric acid, and phosphoric acid and ammonium, alkali metal, and alkaline earth metal salts of phosphoric acid. This patent discloses that the use of such a solution imparts a matte appearance to an autodeposited coating which otherwise would have a glossy appearance and improves the corrosion-resistant properties of the coating. In addition, U.S. Pat. No. 3,647,567 discloses the use of an acidic aqueous solution of chromium trioxide or of water-soluble or acid-soluble chromates and dichromates to improve the corrosion resistance of the resinous coatings described therein. Exemplary chromates and dichromates are sodium, ammonium, lithium, magnesium, potassium and zinc.

Japanese Patent No. 7630247 discloses the treatment of an uncured autodeposited coating with an aqueous solution or dispersion of a vulcanizing agent (for example, a sulfur-containing compound) or of a vulcanizing accelerator (for example, hexamethylenetetramine) to improve the solvent resistance of the cured coating.

In Japanese Patent No. 7630246, it is disclosed that adhesion of the freshly formed or wet coating to the underlying metallic substrate can be improved by contacting the coating with an acidic aqueous solution of an inorganic or organic acid or of an oxidizing agent (for example, sodium permanganate). This in turn leads to the provision of cured coatings which have a more uniform and appealing appearance. In addition to the use of chromium compounds, aforementioned U.S. Pat. No. 3,647,567 teaches the use of an aqueous solution of phosphoric acid to improve the corrosion resistance of the resinous coating described therein.

In addition, Japanese Patent No. 7630245 discloses the treatment of an uncured autodeposited coating with an aqueous composition containing a water-miscible coalescing agent comprising a compound having two or more oxygen-containing functional groups such as ester groups, hydroxy groups, carbonyl groups and ether linkages. Examples of such classes of compounds include alcohols, ketones, alcohol esters, ketone esters, ketone ethers and ester ethers. This Japanese patent discloses that the treatment of uncured autodeposited coatings with such coalescing agents inhibits or deters the tendency of the cured form of the coating to blister, crack and/or bridge.

Chemical treatments of uncured autodeposited coatings, as described above, are ineffective in rendering the coating more impermeable to fluids and/or create waste disposal problems and/or suffer from other drawbacks, including for example, relatively high use costs. Accordingly, the present invention relates to improved means for the chemical treatment of an uncured autodeposited coating to improve properties thereof such as, for example, rendering the cured form of the coating more resistant to water and imparting improved adhesive and heat-resistant properties to the coating.

SUMMARY OF THE INVENTION

In accordance with the present invention, improvements in properties of cured autodeposited coatings are obtained by treating the uncured form of the coating with an alkaline material, preferably with an aqueous solution of an alkaline material, for example, ammonium bicarbonate, or an alkali metal hydroxide, or ammonium hydroxide.

Preferred coatings which are treated according to the process of the present invention are formed from an autodepositing composition in which particles of resin are dispersed in an aqueous acidic solution which is prepared by combining hydrofluoric acid and a soluble ferric iron-containing ingredient, most preferable ferric fluoride. Preferred resins for use in forming autodeposited coatings which are treated according to the present invention comprise internally stabilized vinylidene chloride copolymers or externally stabilized vinylidene chloride copolymers containing in excess of 50 wt. % vinylidene chloride. Most preferably, the vinylidene chloride copolymer is crystalline in nature.

The significance of the present invention can be appreciated readily when it is considered that autodeposited coatings formed from the aforementioned type of preferred autodepositing composition have exceptionally good corrosion resistant properties as evidenced by the ability of such coatings to pass 5% neutral salt spray test (ASTM B-117) at 95° F. for 500 hours or more, such corrosion resistant properties being obtained without subjecting the uncured form of the coating to chromium or other treatment of the type conventionally used to improve the corrosion resistance of autodeposited coatings. Nevertheless, under some conditions, such coatings suffer loss of adhesion to the underlying metallic substrate when subjected to soaking in water for extended periods of time. In accordance with the present invention, such loss of adhesion can be inhibited or deterred by treating the uncured form of the coating with an alkaline material.

Another aspect of the present invention is the discovery that the adhesion of the cured form of the coating to particular types of metallic substrates can be improved by treating the uncured form of the coating with an alkaline material. Still another aspect of the present invention is the discovery that the heat-resistance of a cured autodeposited coating can be improved by treating the uncured form of the coating with an alkaline material.

As will be described in detail below, other aspects of the present invention involve fixing "transient" iron (defined below) in the coating and providing autodeposited coatings which comprise transient iron fixed in the coating with an alkaline material.

Practice of the present invention provides means for providing autodeposited coatings which can be used in applications where the coatings would not otherwise be suitable. Another advantage of the present invention is that improvements in the properties of autodeposited coatings can be realized by the use of a treating solution which does not require the presence of hexavalent chromium or a similarly toxic material which creates waste disposal problems. Other advantages which are attendant with the use of the present invention will be evident from the detailed description of the invention which follows.

DETAILED DESCRIPTION OF THE INVENTION

Coating compositions which form autodeposited coatings of the type that can be treated in accordance with the present invention generally comprise resin-containing acidic aqueous compositions which function to attack and dissolve from a metallic surface contacted therewith metal ions in an amount sufficient to directly or indirectly cause resin particles in the region of the metallic surface to deposit thereon in a continuous fashion, that is, in a manner such that there is a buildup in the amount of resin deposited on the surface the longer the time the surface is in contact with the composition. This deposition of the resin on the metallic surface is achieved through chemical action of the coating composition on the metallic surface. The use of electricity which is necessary for the operation of electrocoating methods is not required.

Basic constituents of an autodepositing composition are water, resin solids dispersed in the aqueous medium of the composition and activator, that is, an ingredient(s) which converts the water/resin composition into one which will form on a metallic surface a resinous coating which increases in thickness or weight the longer the surface is immersed in the composition. Various types of activators or activating systems are known, for example, as reported in U.S. Pat. Nos.: 3,592,699; 3,709,743; 4,103,049; 4,347,172; and 4,373,050, the disclosures of which are incorporated herein by reference. The activating system generally comprises an acid/oxidizing system, for example: hydrogen peroxide and HF; $HNO_3$; and a ferric-containing compound and HF; and other soluble metal-containing compounds (for example, silver fluoride, ferrous oxide, cupric sulfate, cobaltous nitrate, silver acetate, ferrous phosphate, chromium fluoride, cadmium fluoride, stannous fluoride, lead dioxide, and silver nitrate in an amount between about 0.025 and about 50g/l) and an acid that can be used alone or in combination with hydrofluoric acid, and including, for example, sulfuric, hydrochloric, nitric, and phosphoric acid, and an organic acid, including, for example, acetic, chloracetic, and trichloracetic.

The preferred activating system comprises a ferric-containing compound and hydrofluoric acid. Thus, a preferred autodepositing composition comprises a soluble ferric-containing compound in an amount equivalent to about 0.025 to about 3.5 g/l ferric iron, most preferably about 0.3 to about 1.6 g/l of ferric iron, and hydrofluoric acid in an amount sufficient to impart to the composition a pH within the range of about 1.6 to about 5.0. Examples of the aforementioned ferric-containing compounds are ferric nitrate, ferric chloride, ferric phosphate, ferric oxide, and ferric fluoride, the last mentioned being preferred.

U.S. Pat. Nos. 4,347,172 and 4,411,937 which disclose the aforementioned type of preferred activating system disclose the optional use in the composition of an oxidizing agent in an amount to provide from about 0.01 to about 0.2 oxidizing equivalent per liter of composition. Suitable oxidizing agents are those commonly known as depolarizers. Examples of oxidizing agents are hydrogen peroxide, dichromate, permanganate, nitrate, persulfate, perborate, p-benzoquinone and p-nitrophenol. Hydrogen peroxide is mentioned as preferred. The preferred composition for use in the present invention does not include the use of an optional oxidizing agent as disclosed in the aforementioned '172 and '937 patents.

With respect to the resin constituent of the autodepositing composition, although any resin suitable for use in an autodepositing composition can be used, it is preferred that the coating which is treated in accordance with the present invention comprise a resin made from a high proportion of vinylidene chloride monomer, including externally and internally stabilized vinylidene chloride-containing resins, the preferred class of resins being internally stabilized vinylidene chloride-containing resins. In effect, internally stabilized polymers or resins include as part of their chemical structure a surfactant group which functions to maintain polymer particles or resin solids in a dispersed state in an aqueous medium, this being the function also performed by an "external surfactant", that is, by a material which has surface-active properties and which is absorbed on the surface of resin solids, such as those in colloidal dispersion. As is known, the presence of an external surfactant tends to increase the water sensitivity of coatings formed from aqueous resin dispersions containing the same and to adversely affect desired properties of the coatings. The presence of undue amounts of surfactant in autodepositing compositions can lead to problems, as described in U.S. Pat. No. 4,191,676, the disclosure of which is incorporated herein by reference, particularly as regards its description respecting surfactants and amounts thereof in autodepositing compositions. As discussed in this patent, the presence of an undue amount of surfactant in autodepositing compositions can deter the build-up of resin particles on the metallic surface being coated. In addition, the presence of undue amounts of surfactant can also adversely affect desired coating properties, for example, corrosion resistant properties. An advantage of internally stabilized vinylidene chloride-containing polymers is that stable aqueous dispersions, including acidic aqueous dispersions of the type comprising autodepositing compositions, can be prepared without utilizing external surfactants. (It is noted that there is a tendency in the literature to use interchangeably the following terms in connection with describing surface active materials which are used in polymerization processes for preparing polymers of the type to which the present invention relates: surfactant, wetting agent, emulsifier or emulsifying agent and dispersing agent. As used herein, the term "surfactant" is intended to be synonymous with the aforementioned.) Various types of internally stabilized vinylidene chloride-containing polymers are known and species thereof are available commercially. In accordance with the present invention, they can be used to excellent advantage in the practice of the present invention.

Various surfactants which function to maintain polymeric particles in dispersed state in aqueous medium include organic compounds which contain ionizable groups in which the anionic group is bound to the principal organic moiety of the compound, with the cationic group being a constituent such as, for example, hydrogen, an alkali metal, and ammonium. Speaking generally, exemplary anionic groups of widely used surfactants contain sulfur or phosphorous, for example, in the form of sulfates, thiosulfates, sulfonates, sulfinates, sulfaminates, phosphates, pyrophosphates and phosphonates. Such surfactants comprise inorganic ionizable groups linked to an organic moiety.

Although various ways may be used to introduce into the molecular structure of the vinylidene chloride resin such ionizable groups, it is believed that the most widely used method for preparing such resins will involve reacting vinylidene chloride with a monomeric surfactant and optionally one or more other monomers. In such reaction, the monomeric surfactant comprises a material which is polymerizable with monomeric vinylidene chloride or with a monomeric material which is polymerizable with monomeric vinylidene chloride and which is ionizable in the reaction mixture and in the acidic aqueous medium comprising autodepositing compositions.

With respect to particular resins that can be used in the coating composition of the present invention, a preferred class can be prepared by copolymerizing (A) vinylidene chloride monomer with (B) monomers such as methacrylic acid, methyl methacrylate, acrylonitrile, and vinyl chloride and (C) a water soluble ionic material such as sodium sulfoethyl methacrylate. Although the constituents comprising the above-desired resin can vary over a relatively wide range, in general the resin will comprise the polymerized constituents in the following amounts:

1) between 45 and about 99 weight percent based on the total weight of monomers used of vinylidene chloride monomer;
2) from about 0.5 to 30 weight percent based on the total weight of (1) and (2) of a second relatively more hydrophilic ethylenically unsaturated monomeric material wherein such monomeric material has a solubility in both the water phase and the oil phase of the polymer latex of at least 1 weight percent at the temperature of polymerization; and
3) from about 0.1 to about 5 weight percent based on the total weight of other monomers of an ionic significantly water-soluble material which is copolymerizable with (2) and is selected from the group of sulfonic acids and their salts having the formula:

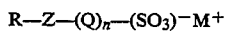

Examples of resins prepared from such monomers are disclosed in U.S. Pat. No. 3,617,368. As disclosed in this patent, the radical "R" is selected from the group consisting of vinyl and substituted vinyl, for example, alkyl-substituted vinyl; the symbol "Z" represents a difunctional linking group which will activate the double bond in the vinyl group; —Q— is a divalent hydrocarbon having its valence bonds on different carbon atoms; and the symbol "M+" represents a cation.

The relatively hydrophilic monomers of (2) above include those materials which are readily copolymerizable with (1) in aqueous dispersion, that is, which copolymerize within a period of about 40 hours at a temperature ranging from the freezing point of the monomeric serum up to about 100° C., and which have a solubility in both the water and the oil phase of the polymer latex of at least 1 weight percent at the temperature of polymerization. Exemplary of preferred materials, particularly when used in conjunction with monomeric vinylidene chloride are: methacrylic acid and methyl methacrylate. Other monomers which may be advantageously employed include the hydroxyethyl and propyl acrylates, hydroxyethylmethacrylate, ethyl hexylacrylate, acrylic acid, acrylonitrile, methacrylonitrile, acrylamide, and the lower alkyl and dialkylacrylamides, acrolein, methylvinyl ketone, and vinyl acetate.

These monomers, which can be employed in amounts of from 0.5 to 30 weight percent, based on the total weight of the nonionic monomers used, provide for the necessary reactivity with the copolymerizable ionic material of (3) and also provide for the required water solubility of the interpolymer in water. Thus, such materials may be referred to as "go-between" monomers. It is to be understood that the optimum amount of such relatively hydrophilic monomers may vary somewhat within the prescribed range depending upon the amount of hydrophobic monomer used in preparing the resin, as well as upon the amount and type of the copolymerizable ionic monomer used.

The copolymerizable ionic monomers used in preparing the aforementioned type resins are those monomeric materials which contain in their structure both an ionizable group and a reactive double bond, are significantly soluble in water, are copolymerizable with the hydrophilic monomer constituent (2) and in which the substituent on the double bond is chemically stable under the conditions normally encountered in emulsion polymerization. Examples of the difunctional linking group (Z) which will activate the double bond present in the vinyl group include groups of the structure:

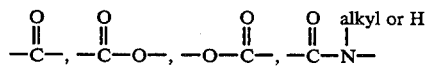

the like. The alkyl group is preferably alkyl of 1 to 8 carbon atoms, especially methyl, ethyl or propyl. Examples of the aforementioned divalent hydrocarbon having its valence bonds on different carbon atoms include alkylene and arylene divalent hydrocarbon radicals. Although the alkylene (CH$_2$) group can contain up to about 20 carbon atoms, it will generally have 1 to about 8 carbon atoms.

The solubility of the defined copolymerizable ionic material as described herein is strongly influenced by the cation M$^+$. Exemplary cations are the free acids, alkali metal salts, ammonium and amine salts and sulfonium and quaternary ammonium salts. Preferred are the free acids, alkali metal salts, particularly sodium and potassium, and ammonium salts.

It is further noted that, with one of the ions above, and the usual choices for R and Z, the solubility of the monomer depends on Q. As indicated, this group can be either aliphatic or aromatic and its size will determine the hydrophilic/ hydrophobic balance in the molecule, that is, if Q is relatively small, the monomer is water soluble, but as Q becomes progressively larger, the surface activity of such monomer increases until it becomes a soap and ultimately a water insoluble wax. It is to be understood, however, that the limiting size of Q depends on R, Z, and M$^+$. As exemplary of the above, it has been found that sodium sulfoalkyl methacrylate of the formula:

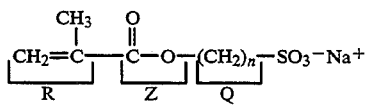

wherein n is 2, is a highly acceptable copolymerizable ionic material for use in the present invention.

Further, the selection of R and Z is governed by the reactivity needed, and the selection of Q is usually determined by the reaction used to attach the sulfonic acid to the base monomer (or vice versa).

Processes for preparing latexes containing resins of the aforementioned type are known, such latexes being commercially available and being referred to herein as "self-stabilizing latexes", that is, latexes, the polymeric particles of which contain in the polymer molecule functional groups that are effective in maintaining the polymeric particles dispersed in the aqueous phase of the latex. As mentioned above, such latexes do not require the presence of an external surfactant to maintain the particles in their dispersed state. Latexes of this type generally have a surface tension very close to that of water (about 72 dynes/cm). It has been observed that autodepositing compositions containing such latexes form coatings which build up at a relatively fast rate.

An exemplary method for preparing such latexes involves preparation of an aqueous dispersion by an essentially continuous, carefully controlled addition of the requisite polymerization constituents (including polymerization initiator systems, if desired) to the aqueous medium having the desired pH value, followed by the subsequent addition of the necessary polymerization initiator, to form a polymeric seed latex in order to aid in the control of particle size. When forming such polymeric seed latexes, very small amounts of conventional surfactants, such as alkali soaps or the like, may be incorporated in the aqueous medium to further aid in the attainment of particles of desired size. The addition of such surfactants, however, is not critical for the production of the highly stable, internally stabilized, aqueous colloidal dispersions of polymeric particles of the type described above. In any event, additions of surfactants are limited so that the total amount present in the aqueous phase of the final coating solution is less than the critical micelle concentration, as taught in aforementioned U.S. Pat. No. 4,191,676. Following the formation of the polymeric seed latex, the remaining polymerization constituents are simultaneously and continuously added under carefully controlled conditions to the aqueous medium.

Highly stable polymer latexes for use in the present invention are characterized by the virtual absence of undesirable coagulum which often results when polymeric latexes are stabilized by conventional water soluble surfactants. Thus, such latexes combine the highly beneficial properties of optimum colloidal stability, reduced viscosities at relatively high polymer solids content, low foaming tendencies, and excellent product uniformity and reproducibility. Such highly stable latexes which are internally stabilized are disclosed, for example, in aforementioned U.S. Pat. No. 3,617,368.

A preferred embodiment of this invention comprises the use of vinylidene chloride-containing latexes in which a water soluble ionic material such as, for example, sodium sulfoethyl methacrylate is copolymerized with the comonomers comprising the copolymer. Sodium sulfoethyl methacrylate is particularly effective for use with monomeric vinylidene chloride and the relatively hydrophilic monomers methyl methacrylate or methacrylic acid when used in the amounts and in the manner called for by the present invention.

Particularly preferred latexes for use in this invention are latexes with about 35 to about 60 weight % solids comprising a polymeric composition prepared by emulsion polymerization of vinylidene chloride with one or more comonomers selected from the group consisting of vinyl chloride, acrylic acid, a lower alkyl acrylate (such as methyl acrylate, ethyl acrylate, butyl acrylate), methacrylic acid, methyl methacrylate, acrylonitrile, methacrylonitrile, acrylamide, and methacrylamide and stabilized with sulfonic acid or sulfonic acid salt of the formula

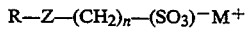

wherein R represents vinyl or lower alkyl-substituted vinyl, Z represents one of the functional groups:

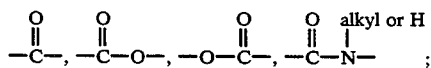

n is an integer from 1 to 20 (preferably 1 to 6), and M+ is hydrogen or an alkali metal cation, preferably sodium or potassium.

A subgroup of preferred polymers are those having at least about 50% by weight of vinylidene chloride, but less than about 70%, and about 5 to about 35% vinyl chloride, and about 5 to about 20% of a vinyl compound selected from the group consisting of acrylic acid, methyl acrylate, ethyl acrylate, butyl acrylate, methacrylic acid, methyl methacrylate, acrylonitrile, methacrylonitrile, acrylamide and methacrylamide, and combinations thereof, and about 1 to about 3% by weight of sulfoethyl methacrylate.

A particularly preferred group of latexes, however, are latexes containing about 30 to about 70 weight % of solids formed by emulsion polymerization of about 50 to about 99% vinylidene chloride based on total weight of polymer and about 0.1 to about 5% by weight of sulfoethyl methacrylate, with optionally other comonomers selected from the group consisting of vinyl chloride, acrylic and methacrylic monomers such as acrylonitriles, acrylamides, methacrylamides and mixtures thereof in amounts between about 5 and about 50% by weight, and substantially free of unpolymerized surfactant or protective colloid.

Among other preferred subclasses of resin for use in this invention are dispersions of copolymers of about 50 to about 90% by weight of butyl acrylate and about 1 to about 2% by weight of sulfoethyl methacrylate based on the total weight of polymer. Another preferred subclass of polymers are the latexes of vinylidene chloride-containing polymers internally stabilized with sulfoethyl methacrylate and free of surfactant, and including optionally vinyl chloride and one or more acrylic co-monomers.

Another preferred vinylidene chloride-containing copolymer is one comprising about 15 to about 20 weight % vinyl chloride, about 2 to about 5 weight % butyl acrylate, about 3 to about 10 weight % acrylonitrile, about 1 to about 2 weight % sulfoethyl methacrylate. This particular copolymer will have less than 70% by weight vinylidene chloride copolymer based upon total weight of comonomers (including the sulfoethyl methacrylate) used in the emulsion polymerization.

In its most preferred form, the present invention comprises the use of internally stabilized vinylidene chloride-containing resins of the type used in Example 1 reported hereinbelow. Such resins are of relatively high crystallinity. Exemplary crystalline resins are described in U.S. Pat. No. 3,922,451 and aforementioned U.S. Pat. No. 3,617,368. Generally speaking, crystalline vinylidene chloride-containing resins comprise a relatively high proportion of vinylidene chloride, for example, at least about 80 wt. % thereof.

Although internally stabilized vinylidene chloride-containing resins are preferred for use in the practice of the present invention, vinylidene chloride-containing resins stabilized with external surfactants can also be used. The use of such resins forms autodeposited coatings which exhibit chemical and physical properties superior to those of autodeposited coatings prepared from resins heretofore known in the state of the art. The externally stabilized vinylidene chloride-containing resins contain a high proportion of vinylidene chloride, that is, at least about 50 wt %, and preferably in excess of 50 wt %. The amount of vinylidene chloride comprising the resin should be less than 100 wt. % for the reason that the pure homopolymer of vinylidene chloride is thermally unstable. It undergoes dehydrochlorination, that is, an "unzippering" depolymerization which leads to complete breakdown of the polymer. The proclivity for thermal instability can be greatly reduced by copolymerizing the vinylidene chloride monomer with comonomers, for example, acrylic comonomers, which can be used to break up the length of the vinylidene chloride sequences by inserting more thermally stable comonomers into the chain thereby preventing further unzippering. In simplistic terms, the use of comonomers in vinylidene chloride polymers is akin to jamming a zipper at a number of points which prevents it from opening more than a short distance.

Examples of monomers that can be copolymerized with vinylidene chloride to form a thermally stable copolymer include one or more of vinyl chloride, acrylic acid, methacrylic acid, methylacrylate, methyl methacrylate, ethylacrylate, butylacrylate, acrylonitrile, methacrylonitrile, acrylamide and methacrylamide. A few examples of externally stabilized vinylidene chloride polymers that can be used in the practice of the present invention are the following: (A) about 50 to about 90 wt % vinylidene chloride, about 5 to about 20 wt % acrylonitrile and about 5 to about 20 wt % butyl acrylate; (B) about 60 to about 76 wt % vinylidene chloride, about 4 to 10 wt % ethylhexyl acrylate or methacrylate, and about 1 to about 4 wt % acrylic acid; and (C) 66 wt % vinylidene chloride and 34 wt % vinyl chloride. In preferred form, the externally stabilized vinylidene chloride-containing resin is crystalline in nature.

Externally stabilized resins of the above type are prepared typically by emulsion polymerization utilizing a sufficient amount of surfactant to maintain the resulting resin particles in a dispersed state in the aqueous medium of the reaction mixture. The nature of this resin type is that the structure of the polymer molecule requires that surfactant be present to maintain the colloidal dispersion of the resulting latex, the surfactant being adsorbed on the surface of the resin particles.

Examples of surfactants (emulsifiers) that can be used to prepare such latexes are: sodium dodecylbenzene sulfonate, alkyl sulfates, sodium dioctyl sulfosuccinate, alkylphenolicethoxylate sulfonates, sodium dodecyldiphenyl oxide disulfonate, sodium oleyl isopropanolamide sulfosuccinate, and sodium lauryl sulfate. These surfactants or emulsifiers are exemplary only; accordingly, it should be understood that the practice of this invention is not limited to latexes containing the aforementioned surfactants. For example, there can be used any anionic surfactant which will lower the interfacial tension between the monomeric reactants and water sufficiently to result in the formation of stable colloidal dispersions of the monomers in the water and, in addition, is stable in autodepositing compositions formulated therefrom. It is noted further that the activating system (for example, acid and oxidizer) of the autodepositing composition functions to dissolve from the metallic substrate positively charged cations which cause the negatively charged latex polymer particles to autodeposit on the metallic surface. The anionic surfactant should be a material which functions accordingly. Mixtures of two or more suitable anionic surfactants may be used.

For reasons mentioned above, and as explained in aforementioned U.S. Pat. No. 4,191,676, the surfactant concentration of externally stabilized latexes should be relatively low so that the aqueous phase of the autodepositing composition has a surfactant concentration below the critical micelle concentration and preferably below the surfactant concentration which corresponds to the inflection point on a graph of surface tension versus the logarithm of surfactant concentration in the composition, as referred to in the aforementioned '676 patent. Accordingly, it is preferred that the latex containing the externally stabilized resin be prepared by emulsion polymerization with a very low concentration of surfactant. In the present state of the art, this is best achieved by seed polymerization or semi-continuous polymerization as opposed to batch emulsion polymerization. In the seed polymerization process or semi-continuous polymerization, the amount of surfactant can be limited by adding surfactant and monomer in such a manner that the monomer continues to polymerize with particles already present rather than forming new particles. This gives greater uniformity of particle size distribution and also gives good control of the total amount of surfactant in the latex. The stability of the colloidal latex can be partially attributed to charged polymer and groups whose provenance is the polymerization initiator.

In general, such latexes will have a relatively high surface tension, that is, at least about 40 dynes/cm. Such latexes can be used in the practice of the present invention, and preferably, there are used such latexes that have a surface tension of about 55 to 70 dynes/cm. In particular, such latexes in which there is no protective colloid are a preferred class for use in the present invention.

Polymers having a vinylidene chloride content of between about 50 wt % and about 90 wt % or higher, based upon the total weight of polymer, can be used. When vinyl chloride is employed as one of the comonomers, the vinylidene chloride content can be less than about 70 wt %. The total chloride content, however is preferably 50 wt % or more based on total polymer weight. Generally speaking, the internally stabilized latexes, which are the preferred class of latexes according to this invention, can be used at even lower chloride contents, thereby enabling the inclusion of other copolymers to enhance the desirable polymer characteristics such as hardness, gloss, solvent resistance and the like, in addition to corrosion resistance attributable to reduced vapor permeability.

Latexes containing vinylidene chloride resins for use in the practice of the present invention are available commercially. Examples of such latexes are the Saran latexes such as, for example, Saran 143 and Saran 112 available from Dow Chemical Co., the Serfene latexes available from Morton Chemical, and the Haloflex latexes such as, for example, Haloflex 202 available from Imperial Chemicals Industries.

Vinylidene chloride-containing resins of the type described above can be used in autodeposition to form coatings which have highly desirable properties. For example, the coatings can be cured at relatively low temperature, such as temperatures within the range of about 20° C. to about 120° C. Coatings having a very high order of corrosion resistance can be obtained without the use of a chrome after-treatment. In addition, coatings having a high degree of hardness and resistance to solvents can be produced, and the freshly formed coatings can have particularly good adhesive and cohesive properties, as exhibited by their being able to be spray rinsed at relatively high pressures. In accordance with the present invention, the water impermeability of such coating can be improved further by treatment with an alkaline solution, as described in detail below.

Examples of other resins that can be used in autodepositing compositions are referred to in the following U.S. Pat. Nos.: 3,585,084; 3,709,743; 4,191,676; 4,313,861 and 4,347, 172. Coatings formed from such resins can also be treated in accordance with the present invention.

If desired, the autodepositing composition can be prepared from two or more different resins. In preferred form, such a composition will comprise a blend of the vinylidene chloride-containing polymers described above, typically in an amount of about 50 to about 95% of the total resin solids, and one or more other resins including, for example, styrenebutadiene resins, poly(vinyl chlorides), acrylic resins and the like.

The amount of the resin comprising the coating composition can vary over a wide range. The lower concentration limit of the resin particles in the composition is dictated by the amount of resin needed to provide sufficient material to form a resinous coating. The upper limit is dictated by the amount of resin particles which can be dispersed in the acidic aqueous composition. In general, the higher the amount of resin particles in the composition, the heavier the coating formed, other factors being the same. Although coating compositions can be formulated with a range of about 5 to about 550 g/l of resin solids, the amount of the resin solids will tend to vary depending on the other ingredients comprising the composition and also on the specific latex or resin used. For many applications, good results can be achieved utilizing about 50 to about 100 g/l of resin solids in the composition.

Optional ingredients can be added to the composition as desired. For example, it is believed that the present invention will be used most widely in applications where it is desired to apply pigmented coatings to the metallic substrate. For this purpose, suitable pigments can be included in the composition. Examples of pigments that can be used are carbon black, phthalocyanine blue, phthalocyanine green, quinacridone red, benzidene yellow and titanium dioxide. The pigment should be added to the composition in an amount which imparts to the coating the desired color and/or the desired depth or degree of hue. It should be understood that the specific amount used will be governed by the specific pigment used and the color of coating desired. Excellent results have been achieved by using the aqueous dispersion in an amount such that the composition contains about 0.2 to about 3 g of furnace black/100 g of resin solids.

Many pigments are available in aqueous dispersions which may include surfactants or dispersing agents for maintaining the pigment particles in dispersed state. When utilizing such pigment dispersions, they should be selected so that the surfactant concentration in the aqueous phase of the composition is below the CMC, preferably below the surfactant concentration which corresponds to the inflection point on a graph of surface tension versus the logarithm of surfactant concentration in the composition. The surfactant should preferably be selected from those indicated above with respect to the preparation of the externally stabilized latexes. Suitable pigmented compositions are illustrated in examples herein.

Colored coatings can be produced also by the use of dyes, examples of which include rhodamine derived dyes, methyl violet, safranine, anthraquinone derived dyes, nigrosine, and alizarin cyanine green. These are but a few examples of dyes that can be used.

Examples of other additives that may be used in the autodepositing composition are those generally known to be used in formulating paint compositions, for example, UV stabilizers, viscosity modifiers, etc.

If a surfactant is added to the composition, either as a component of the latex, or with a pigment dispersion, or with other ingredients or additives, the total amount of surfactant in the aqueous phase of the composition should be maintained below the CMC. Preferably, the aqueous phase of the composition contains little or no surfactant.

In case a surfactant is utilized, the preferred surfactants are the anionic surfactants. Examples of suitable anionic surfactants are the alkyl, alkyl/aryl or naphthalene sulfonates, for example, sodium dioctylsulfosuccinate and sodium dodecylbenzene sulfonate.

In preparing the autodepositing composition, the constituents thereof can be admixed in any suitable way, for example, as described in aforementioned U.S. Pat. No. 4,191,676. In preparing a bath of pigmented coating composition for use on an industrial scale, it is preferred that the bath be prepared by admixing:

A) an aqueous concentrate comprising about 350 to about 550 g/l of resin particles, preferable the aforementioned vinylidene chloride-containing resin particles and about 10 to about 550 g/l of pigment; and B) an aqueous concentrate prepared from about 0.4 to about 210 g/l of HF and a water soluble ferric-containing compound in an amount equivalent to about 1 to about 100 g/l of ferric iron.

The bath can be prepared by stirring water into concentrate (A) and thereafter admixing therewith the required amount of concentrate (B) with stirring to provide a homogenous composition.

Various steps of the overall coating process in which the present invention is used can be like those of the prior art, except as noted below. For example, cleaning of the metallic surface prior to coating can be in accordance with the teachings of aforementioned U.S. Pat. No. 4,191,676. With respect to contacting the metallic surface with the autodepositing composition, it is believed that, for most applications, desired coating thicknesses can be obtained by immersing the metallic surface in the composition for a period of time within the range of about 30 seconds or even less to about 3 minutes. Good results have been achieved utilizing a time of immersion of not more than about 90 to about 100 seconds with compositions containing about 5 to about 10 wt % of resin solids. However, it should be understood that longer or shorter periods of time can be used. Agitating the composition aids in maintaining it uniform and in improving the uniformity of the coatings formed. Other factors held constant, heating of the composition will result in heavier coatings. However, satisfactory results can be obtained by operating the coating process at ambient temperature.

In a typical industrial process, the freshly applied coating is rinsed with water after the coated surface has been withdrawn from the composition and before significant drying of the wet coating takes place. Such water rinsing is effective in removing therefrom residuals, such as acid and other ingredients of the composition that adhere to the coated surface. If such residuals are allowed to remain on the coated surface, they may change or adversely affect the quality of the coating. Improvements in rendering the cured form of the coating more impermeable to water, as provided by the present invention, are not realized by simply water rinsing the freshly formed coating. However, such improvements can be realized and residuals which adversely affect the coating quality can be removed or rendered unreactive in accordance with the present invention by treatment with an alkaline solution, suitably a mild alkaline solution, for example, a solution of about 0.1 to about 2 g/l of caustic.

Thus, after the freshly formed, wet, uncured coating is formed, it is subjected to a chemical treatment in accordance with the present invention, preferable by contacting the coating with an aqueous alkaline solution, that is, a solution containing more hydroxyl ions than hydrogen ions. Such treatment can be used to improve the water impermeability of the cured form of the coating. For example, and with reference to coatings comprising vinylidene chloride-containing resins of the type mentioned above, it has been found that, although such coatings exhibit excellent resistance to corrosion when evaluated in accordance with a standard salt spray test (ASTM B-117), their adhesion to the underlying metallic substrate is affected adversely when they are soaked in water for an extended period of time, for example, two hours. As will be seen from examples reported below, treatment of the uncured coating in accordance with the present invention permits the cured coating to successfully pass a test involving extended water soaking.

In connection with the development of the present invention, it has been observed that the alkaline-treated coating in its cured form contains a higher proportion of iron than a cured coating which is formed from one which has been rinsed with plain water. The source of such iron can derive from a ferric-activating ingredient comprising the autodepositing composition and/or, in the case of coating a ferriferous surface, from iron dissolved from the metallic surface during contact with the autodepositing composition. It is believed that residual iron (hereafter referred to as "transient iron") which is present in the freshly formed wet coating and that would normally be removed from the wet coating by a conventional water rinse or other post-rinse treatment is precipitated or otherwise affixed in the coating by the chemical treatment of the present invention. It is believed also that such iron that remains in the coating as a result of such chemical treatment is directly and/or indirectly responsible for rendering the cured coating more impermeable to fluids, including, for example, water. Accordingly, any material which causes such transient iron to remain in the coating can be used to render the coating in its cured form more impermeable to fluids.

In preferred form, the freshly formed coating is contacted with a solution of one or more soluble materials which are effective in affixing transient iron in the coating. Most preferably, the solution is an aqueous alkaline solution containing ammonium bicarbonate, ammonium hydroxide or an alkali metal hydroxide such as, for example, lithium, potassium, and sodium. It is believed that the use of such materials converts transient iron into iron hydroxide which remains in the coating. The presence of such transient iron may lead to the development of a certain amount of color in the coating. However, use of an alkaline solution of this invention containing ammonium bicarbonate minimizes such color development. Examples of other materials which can be used in forming an alkaline solution include amines. Especially preferred is an aqueous alkaline solution which contains an alkaline material which is volatile under curing conditions for the coating. Examples of such alkaline materials include ammonium bicarbonate and ammonium hydroxide.

Generally speaking, the chemical treatment of the freshly formed coating can be effected at room temperature (although elevated temperatures can be used), with the time of contact, the means of contact, and the temperature of contact being interrelated so as to deposit sufficient chemical on the coating, but not so much as to adversely affect the coating. Exemplary means for applying an alkaline solution to the freshly formed coating include spray, mist, and immersion, with excellent results having been achieved by immersing the freshly coated surface in an aqueous alkaline solution. When using relatively small amounts of material in the alkaline solution, contact times will of necessity be much longer than when using a solution containing relatively high amounts of material, for example, amounts which correspond to the saturation level of the material in solution. Preferably, the solution contains about 2 to about 15 g/l of alkaline material, with the preferred means of applying such solution being immersion of the freshly coated surface in the solution for a period of time of about 5 seconds to about 5 minutes.

As mentioned above, it has been discovered that chemical treatment of the uncured autodeposited coating in accordance with the present invention improves the adhesion of the cured form of the coating to certain types of metallic substrates, including steel and tin surfaces. It has been observed that the adhesive bond of an autodeposited coating to a heat-treated steel surface or to a tin-plated surface tends to be of poor strength. This is evidenced by the removal of an autodeposited coating from the heat-treated steel or tin surface when tape is applied to the cured form of the coating and removed therefrom. In an ideal situation, none of the coating should stick to the tape, that is, it should remain adhered to the metallic surface. However, and as will be seen in the example section below, there are applications where significant portions or substantially all of the coating pulls away from the metallic surface and sticks to the tape as it is removed therefrom. This type of adherence problem has not been observed in applications where the steel has not been subjected to a heat-treating operation.

Heat-treating steel is well-known, for example, as described in Van Nostrand's Scientific Encyclopedia, Fifth Edition, Van Nostrand Reinhold Company, Iron Metals, Alloys and Steels, page 1407 (1976). Steel is subjected to heat treating in order to improve properties thereof, including, for example, strength properties. Steels which are often subjected to heat treating are those which have a relatively high carbon content, for example, about 0.5 wt. % carbon or more. An example of such a steel is AISE-SAE No. 5160 which includes 0.55–0.65 wt. % carbon, 0.70–0.90 wt. % chromium, and 0.75–1 wt. % manganese.

Treatment of an uncured autodeposited coating applied to the surface of a heat-treated steel substrate or a tin surface with an alkaline material in accordance with the present invention is effective in improving the adhesive properties of the cured coating to the surface. Preferred alkaline materials for this purpose are ammonium bicarbonate and alkali metal hydroxides including, particularly sodium and potassium.

As also mentioned above, an additional discovery stemming from the use of the present invention is that the heat resistance of the uncured form of an autodeposited coating can be improved. An important aspect of the present invention is that such improvements are imparted also to coatings formed from the preferred resins described hereinabove. It is believed that treating the uncured coating with an alkaline material inhibits the tendency of a vinylidene chloride-containing resinous coating to dehydrohalogenate at elevated temperatures. It is believed also that the alkaline material affects iron in the coating in a manner such that the iron is deterred from causing a catalytic decomposition of the vinylidene chloride resin. As a result of the improved heat-resistant properties, the coated articles can be used in a variety of high-temperature applications such as, for example, automotive underhood parts.

After chemical treatment of the freshly formed coating in accordance with the present invention, the treated coating can, if desired, be subjected to a plain water rinse and/or other chemical treatment which is effective in improving the autodepositing process or the autodeposited coating produced therefrom. In one embodiment of the invention, the components of the alkaline rinse solution are volatile, i.e., the solution is "fugitive," and a water rinse to wash off residual salts, etc. is not be necessary. Aqueous ammonium hydroxide and ammonium bicarbonate exemplify such fugitive alkaline rinse solutions. As between ammonium hydroxide and ammonium bicarbonate, the latter is a weaker base, and ammonium bicarbonate promotes crystallinity in the coating. Higher crystallinity is generally believed to provide a coating with lower water permeability.

In a process which involves the formation of a coating comprising the preferred vinylidene chloride-containing resins described above, excellent results on adhesion following a water soak have been achieved by rinsing the alkaline treated coating with plain water and then proceeding directly to cure the coating. However, for applications which involve treating the uncured coating to improve its bond strength to a surface such as a tin or heat-treated steel surface, the alkaline-treated surface should not be rinsed with water prior to curing. In this regard, ammonium bicarbonate is preferred in the alkaline rinse solution, because of its fugitive nature, resulting in improved coating adhesion and enhanced performance in salt spray tests.

Following a final rinse, the coating should be cured. Fusion of the resinous coating renders it continuous, thereby improving its resistance to corrosion and its adherence to the underlying metallic surface.

The conditions under which the curing and/or fusion operation is carried out depend somewhat on the specific resin employed. In general, it is desirable to apply heat to fuse the resin, although various of the vinylidene chloride-containing resins described above can be cured at room temperature. Generally, the corrosion resistant, hardness and solvent resistant properties of coatings fused at elevated temperatures have been observed to be better than coatings which have been air dried. However, there are applications where air dried coatings can be used satisfactorily. The fusion of the coating should be carried out under temperature and time conditions which do not adversely affect the desired properties of the coating. Exemplary conditions used in fusing the aforementioned vinylidene chloride-containing coatings are temperatures within the range of about 20° C. to 120° C. for periods of time within the range of about 10 to 30 minutes, depending on the mass of the coated part. Baking the coating for a period of time until the metallic surface has reached the temperature of the heated environment has been used effectively.

When baked in an oven, the coating reaches the proper "curing" or heating temperature for the full development of coating properties when the metal part reaches that temperature. For this reason, parts that are constructed of thicker steel require longer times to reach the required temperature. For massive parts, it may not be possible to reach the required temperature without deleteriously affecting the coating and causing it to degrade.

In some cases, it is possible to overcome this problem by resorting to infrared radiation curing. In this case, it is possible to cure the coating without simultaneously raising the temperature of the metal to the required temperature. However, infrared radiation curing is practicable only for simple geometric shapes, since the area to be cured must be exposed to the infrared. In using infrared radiation curing, all coated surfaces must be visible to the infrared source, that is, the entire coated surface must "see" the infrared.

Autodeposited coatings can also be "cured" or heated to such a degree that those properties which depend upon proper bake schedule, such as, for example, corrosion resistance adhesion, and hardness can be readily achieved, even on massive parts, as well as relatively thin wall parts, by the simple expedient of treating the freshly coated part with hot water or steam. Exemplary treating means include spraying the freshly applied coating with hot water, immersing the freshly coated part in hot water and exposing the freshly deposited coating to an atmosphere of steam. By the use of such technique, heat can be transferred more quickly into he coated mass with the result that the temperatures needed for full development of coating properties are reached more quickly than they are reached when heating the coated part in air.

The curing of autodeposited coatings in general, including vinylidene chloride-containing coatings of the type described above, is the subject of applicant's aforementioned U.S. Pat. No. 4,562,098, entitled "Water or Steam Cure of Autodeposited Coatings". The disclosure of said patent as it pertains to the autodeposited coatings described therein and the water or steam curing thereof, is incorporated herein by reference. As disclosed in said patent, the types of autodeposited coatings that particularly lend themselves to being so cured are those comprising resins which develop fully their coating properties at the elevated temperatures used, that is, temperatures up to 212° F. in the case of water and steam at atmospheric pressure, and higher temperatures in the case of super heated steam, and which are not degraded at such temperatures. As also disclosed in said patent, it is believed that such a curing process will be used most widely in curing autodeposited coatings comprising resins which have a minimum film temperature (MFT) or glass transition temperature (Tg) of no greater than about 140° F., preferably no greater than about 100° F., and most preferably no greater than about 85° F.

Vinylidene chloride-containing resins of the type mentioned above can have Tg's within the range of about 30° F. to about 85° F. They can also have an accelerated cure temperature of no greater than about 300° F. With respect to resins having a Tg well below room temperature, improvements can be realized by curing with water having a temperature of at least 70° F. In general, however, it is believed that most curing applications will utilize hot water, for example, water having a temperature of 100° F. or more.

Resins which do not inherently have Tg's or MFT's in the desired range can be modified by the use of solvents or plasticizers in accordance with the state of the art to reduce their Tg and MFT values appropriately.

The temperature and time of treatment of the autodeposited coating will depend upon the nature of the particular resin comprising the coating. The treating conditions should be selected so that the properties of the coating are fully developed and so that the coating is not affected adversely. Exemplary conditions include treating times of about 5 seconds to about 5 minutes (although longer times can be used) at temperatures within the range of about 185° F. to about 212° F. (although higher temperatures can be used in the case of super heated steam). It is believed that many applications will require no more than abut 2 to 3 minutes and even less time of treatment when using temperatures within the aforementioned range. Particularly, in the case of steam, there may be many applications in which the treating time is less than 5 seconds. Autodeposited coatings comprising vinylidene chloride-containing resins of the type described above can be properly heated or "cured" to achieve full development of coating properties by immersion of the freshly formed autodeposited coating into hot water for as little as about 5 to about 30 seconds at temperatures of about 185° F. to about 212° F.

Steam curing has a number of advantages over the "hot water cure" method described above. One advantage accruing to the use of a steam atmosphere for curing the freshly formed coating is that the parts need not be immersed. This is important when parts are being processed on a conveyor line. In order to immerse a part in hot water, the conveyor line must change directions as the part is carried down into a tank of hot water.

Once the part has been "cured", the conveyor must then change directions again to remove the part from the hot water tank. By the use of steam to effect curing of the autodeposited coating, the conveyor simply carries the parts into a tunnel which contains the steam. There is no need for the conveyor to change directions as in an immersion process.

A further advantage accruing to the use of steam for curing autodeposited coatings is that steam has a higher calorific value than does hot water. For example, a gram of steam at 212° F. has a higher heat content than a gram of water at the same temperature. This provides a greater energy source for transferring energy rapidly to the freshly formed autodeposited coating. Still another advantage accruing to the use of steam is that only a relatively small amount of water need be converted to steam as opposed to raising the temperature of an entire tank of water to the operating temperature.

The steps of alkaline rinsing the freshly formed autodeposited coating in accordance with the present invention and curing of the coating can be combined into one step. Thus, for example, rinsing and curing can be done simultaneously by spraying with a hot aqueous solution of alkaline or immersing the freshly formed autodeposited coated surface into a bath of hot aqueous alkaline solution. In addition, the water or steam cure process can be used in combination with heretofore known curing methods. For example, a short treating time in accordance with the curing method of the present invention can be used to quickly heat the coating (which surprisingly can result in drying of the coating) followed by baking.

It is generally believed that corrosion of coated metal surfaces occurs when moisture permeates the protective coating and permits the transport of electrons or ions between microcathode and microanode sites on the metal substrate through the electrolyte. Moreover, the water content of the protective coating significantly affects the adhesion of the coating and, at high humidities, may actually cause the coating to separate from the metal. By decreasing the permeability of the protective coating to moisture, therefore, ionic dissolution, ionic transport and diffusion, osmotic blistering, and losses of adhesion on exposure to high humidity are significantly mitigated.

Polymeric films exhibit decreasing moisture vapor transmission rate (MVTR) as their content of chemically bound chlorine increases. Pure homopolymers of vinylidene chloride, for example, comprise two chemically bound chlorine atoms for each monomer unit or more than 70 wt %. The MVTR decreases linearly with increasing content of chemically bound chlorine so the homopolymer of vinylidene chloride has a very low permeability, on the order of 10 grams of moisture vapor through a square meter of film 25 microns thick in 24 hours. By comparison, for example, a latex film based on a polymer comprising a 1:1 ratio of methyl methacrylate and butyl acrylate has an MVTR of 1290 g/25 u/m2/day.

The moisture vapor permeability and water sensitivity of vinylidene chloride copolymer films can be deleteriously affected by increasing concentrations of surfactant used in the process for preparation of the vinylidene chloride-containing polymer. In an earlier part of this disclosure, it was shown that high surfactant concentrations are also undesirable in autodeposition. Accordingly, for purposes of this invention, it is preferred that the latex used in formulating the composition and the autodepositing composition itself contain a very low concentration of surfactant or no surfactant.

The vapor permeability, as measured by cast film water vapor transmission rate (WVTR), of preferred resins is less than about 50 g/mil/m$^2$/day and preferably less than 20 g/mil/m$^2$/day. The film of these preferred resins, when applied in accordance with the preferred autodepositing method of this invention, that is, the method which utilizes an autodepositing composition containing an hydrofluoric acid/ferric fluoride activating system, provides a coated surface in which the vapor permeability, based upon improved corrosion resistance, is substantially less than that of a film cast from the same latex.

Preferred operating steps for forming resinous coatings on steel surfaces, for example, car frames made from hot rolled steel, which coatings provide excellent corrosion resistance after being subjected to salt spray (ASTM B117) for at least 500 hours include the following:

A) cleaning the steel surface, preferably to the extent that a waterbreak-free film can be formed on the surface;
B) water rinsing the cleaned surface to remove therefrom residual cleaning agent;
C) immersing the surface in the preferred pigmented coating composition, as described above for a period of time of about 45 to about 90 seconds to form on the surface a coating having a thickness of about 0.4 to about 1.2 mil;
D) withdrawing the coated surface from the composition and, either immediately or after a partial air dry of about 30 to about 60 seconds, chemically treating the freshly formed coating in accordance with the present invention, and thereafter water rinsing the coated surface; and
E) drying the coated surface at a temperature within the range of about 10° C. to about 120° C. for a period of time of about 10 to about 30 minutes.

An alternative to Step (E) above is to immerse the coated part in hot water or subject it to steam as described above.

EXAMPLES

Examples below are illustrative of the practice of the present invention. Comparative examples are set forth also. The coating composition used initially comprised the following:

| Ingredients | Amounts |
| --- | --- |
| Saran 143 latex | 130 g (about 7 wt % resin solids) |
| ferric fluoride | 1.8 g |
| hydrofluoric acid | 2.3 g |
| Aquablak S (black pigment dispersion) | 5 g |
| deionized water | to make 1 liter |

The latex used contains a crystalline vinylidene chloride copolymer which is prepared by copolymerization with a water soluble ionic stabilizer such as sodium sulfoethyl methacrylate.

The Aquablak S dispersion (available from Borden) was thinned with an equal weight of deionized water to produce a consistency approximately equal to that of the latex. While stirring continuously, the latex was slowly added to the diluted black pigment dispersion. When the black pigment has been uniformly blended with the latex, deionized water is added with continuous stirring. A solution comprising the hydrofluoric acid and the ferric fluoride is added to the mixture with continuous stirring in such a volume that the blend approaches 1 liter of volume, for example, 950 ml. Deionized water is then added to bring the total volume of composition to 1 liter. The resulting composition comprises about 7% by weight of resin solids.

The metallic surfaces coated in the first group of examples are steel head lamp mounting rings. The rings were cleaned with a conventional alkali cleaner and rinsed with water prior to being coated. The rings were mounted in vertical relationship on a rack which was immersed in the autodepositing composition, the rings in the lowest position being in contact with the composition for about 150 seconds, and the rings in the top most position being in contact with the composition for about 97 seconds.

In the control or comparative examples, the coated rings were immersed in a bath of water at ambient temperature for between about 49 to 104 seconds and then in a second water bath at ambient temperature for between about 49 to 104 seconds, the immersion times varying depending of the positions of the rings on the rack. Following the two water rinse steps, the coated rings were cured for a total of 22 minutes first in an oven for 7 minutes at a temperature of 160° F., and then in an oven for 15 minutes at 240° F.

The cured coated rings were then subjected to a soak test. The test is described in the July 1970 General Motors publication No. GM 4350-M at page P-81.101 and P-81.102, incorporated herein by reference. Procedures for carrying out these tests are detailed in the December 1954 General Motors publication No. GM 4466-P at page W-67 entitled "Recommended Practice For Water Immersion Testing" and the July 1970 General Motors publication GM 9071-P at pages W-63.601 to W-63.603, entitled "Tape Adhesion Test For Paint Finishes". Simply stated, coated parts are immersed in water for 2 hours at 100° C. Blistering or other appearance changes following immersion represent a coating failure. In addition, a 0.12 inch peel back of coating from the intersection of lines scribed in the coating following water immersion or peeling of the coating following the removal of, for example, No. 710 3M tape applied thereto constitutes a coating failure.

EXAMPLE NO. 1-C

In this group of control examples, a multiplicity of rings were continuously coated in a bath of autodepositing composition of the type described above and under the conditions described above except that the resin solids content of the composition was varied between about 4 and about 6 wt. % and the ferric fluoride concentration was varied between about 1.3 and about 1.9 g/l. The testing of selected or representative rings utilizing the aforementioned water soak test showed that erratic results were obtained with a vast majority of the rings failing the test, as evidenced by severe (in excess of 50%) coating loss.

EXAMPLE NO. 1

In this group of examples, which are representative of the practice of the present invention, the process described above was modified in that the uncured coated rings were immersed in an aqueous solution containing 2 g/l of sodium hydroxide after which the thus treated rings were immersed in a water bath, the immersion times being like those mentioned above in connection with the control examples. The resin solids content of the autodepositing composition was varied between about 4.8 to about 6.8 wt % and the ferric fluoride concentration between about 1.5 and about 1.6 g/l. In addition, after initially curing the coated rings at the aforementioned 160°/240° F. temperatures as described above, the curing conditions for other parts were changed to cure at 212° F. for the aforementioned 22 minute period. About 25% of the production involved curing at the 160°/240° F. conditions, the remainder of the production being cured at the 212° F. temperature. Representative samples of the coated rings were tested periodically in the aforementioned water soak test. The tests showed consistently marked improvement in reducing the coating loss relative to the control examples, with less than 5% coating loss being observed. It was observed also that improved and more consistent results were achieved with respect to the coated parts that were cured at 212° F.

Additional experiments along this line, but in which the uncured parts were first rinsed in tap water, then in aqueous ammonium bicarbonate at levels ranging from 1 g/L to 5 g/L, gave coating losses of less than 5%.

EXAMPLE 2

In this group of examples, coated rings rinsed in aqueous alkaline solutions containing varying concentrations of NaOH were tested by the aforementioned water soak test. Rings were coated in the previously described coating bath having between about 2.6 to about 2.8 g/l of ferric fluoride and about 5.9 to about 6.4% by weight of resin solids. Coated rings were cured in two oven temperature zones, the first zone being at 160° F. and the second zone at 240° F. for 7 and 15 minutes respectively. Results are presented in the table below.

| NaOH Rinse | % Coating Loss |
| --- | --- |
| 0.0 g/l NaOH | more than 50% |
| 1.0 g/l NaOH | 20% ± 10% |
| 2.0 g/l NaOH | less than 5% |
| 3.0 g/l NaOH | less than 5% |
| 4.0 g/l NaOH | less than 5% |

The next group of examples shows the treatment of uncured autodeposited coatings with an alkaline rinse and the improvement in gloss of the cured form of the coatings. The results of salt spray testing are reported also.

EXAMPLE NO. 3

Cleaned unpolished steel Q-panels were immersed for 30 seconds in a coating composition of the type described above, except that it included 5% resin solids and 1.5 g/l of ferric fluoride. The coated panels were then rinsed for 30–60 seconds and thereafter baked for 20 minutes at 100° C.

Gloss of the coated panels was determined by shining a light at a 60° angle on the surface of each. Measurements were made using a gloss meter (Gardner ® Gloss Gard, Pacific Scientific, Gardner Laboratory Division, Maryland, U.S.A.).

The table which follows compares the percent reflection achieved by rinsing coated panels in rinse solutions of the indicated NaOH concentrations.

| Concentration NaOH in rinse water (g/l) | % Reflection with 60° Head |
|---|---|
| 0.0 | 12.0–14.0 |
| 0.1 | 27.0 |
| 1.0 | 27.0 |
| 2.0 | 25.0 |
| 3.0 | 32.0 |
| 5.0 | 34.0 |
| 10.0 | 21.0 |

The improvement in gloss is evident from the above results.

Panels coated in the manner described above were also subjected to neutral salt spray test ASTM B-117 for 504 hours. Panels coated and then rinsed in plain water gave a scribe rating of 7.5 and field of 8.5. Panels rinsed first in an aqueous 5 g/l NaOH solution and then plain water gave a scribe rating of 8 and field of 9.0. In comparable tests in which ammonium bicarbonate was employed in the last rinse, a scribe rating of 8 was obtained. Thus the test results show that the corrosion resistance of coated panels treated in accordance with the present invention are improved.

The use of ammonium bicarbonate is especially effective to improve the corrosion resistance of enclosed coated surfaces. Such surfaces can be simulated by omitting agitation of the coating and rinse baths, with results such as those tabulated below after 500 hrs neutral salt spray.

| Reaction Rinse | Agit. | Film Build (mil) | Scribe | Field |
|---|---|---|---|---|
| None | Yes | 0.59 | 7.5 | 9 |
| " | No | 0.31 | 4 | 7 |
| 1 gm/L NH4HCO3 | Yes | 0.59 | 7 | 9 |
| " | No | 0.34 | 7.5 | 8 |

In connection with the development of the present invention, various observations have been made respecting the provision of improvements in water impermeable properties of autodeposited coatings. For example, it has been observed that improvements in such properties, as evidenced by water soak tests, can be obtained by increasing the ferric iron content of the autodepositing composition and/or by increasing the resin solids content of the composition. However, there are various disadvantages associated with the adjustment of such parameters. For example, increasing the ferric iron content of the composition can result in an undesirable increase in the rate of metal dissolution, which in turn can lead to various bath control problems. With respect to increasing the resin concentration of the bath, this tends to increase the overall cost of the coating process.

The next examples illustrate the use of the present invention to improve the adhesion of an autodeposited coating to a tin-plated surface and to a heat-treated steel surface.

EXAMPLE NO. 4

In this embodiment of the invention, an autodeposited coating was formed on a clean tin-plated surface using an autodepositing composition of the type described in Example No. 3 above and an immersion time of 90 seconds. After withdrawing the coated tin-plated surface from the composition, it was immersed in water for 30 seconds, and thereafter immersed for 60 seconds in an aqueous solution containing about 3 g/l of NaOH. Thereafter, the thus treated coating was cured in an oven for 27 minutes at a temperature of 230° F.

The adhesion of the coating to the tin surface was then evaluated by applying 3M tape to the cured coating. Upon removal of the tape, it was observed that no coating had adhered to the tape.

In a control example which involved rinsing the freshly coated part with plain water and then curing the coating under the aforementioned conditions, it was observed that a substantial amount of coating was adhered to the tape when it was removed from the coated part.

Improvements in adhesion of this type have been observed also when this sequence of treatment steps is used in connection with autodeposited coatings formed on other metallic substrates, for example, heat-treated ferriferous surfaces, as described in the next group of examples.

EXAMPLE NO. 5

The test work described hereafter involved the coating of heat-treated steel articles consisting of the yoke portion of the intermediate shaft of an automotive steering mechanism.

The autodepositing composition used in the test work was as follows.

| Ingredients | Amounts |
|---|---|
| resin | 48 g |
| ferric fluoride | 3.1 g |
| hydrofluoric acid | 0.8 g |
| Aquablak 255 (black pigment dispersion) | 3.8 g |
| Dowfax 2A1 surfactant | 0.35 g |
| deionized water | to make 1 liter |

The source of the resin was the latex used in the previous examples, that is, Saran 143 latex which contains crystalline vinylidine chloride copolymer. The surfactant is a sodium salt of an alkylated diphenyl oxide disulfonate.

The heat-treated steel articles used in the testing were immersed in the composition for 90 seconds. Coating took place at ambient temperature and the coatings formed were about 0.5 mil in thickness. About 1 minute after the articles were withdrawn from the coating composition, they were rinsed in water for 30 seconds, and 1 minute after completion of the water rinse, they were immersed for 1 minute in the aqueous treating solutions described in the table below. Thereafter the coatings were cured for about 40 minutes in air heated to about 212° F. After the coated parts cooled to room temperature, the adhesive properties of the coatings were evaluated by applying pieces of 3M tape to the cured coatings, removing the pieces of tape and observing the extent to which coating adhered to the pieces of tape. The table below indicates the proportion of coating that remained on that portion of the surface of the article from which the piece of tape was removed.

| Aqueous Treating Solution | Coating Retained on Surface |
|---|---|
| none used - control example | none |
| 3 g/l of NaOH | 95% |
| 3.15 g/l of NaF | 99% |
| 2.63 g/l of NH4OH | 5% |
| 5.26 g/l of NH4OH | 20% |

| Aqueous Treating Solution | Coating Retained on Surface |
|---|---|
| 10.52 g/l of NH₄OH | 30% |
| 3 g/l of NH₄HCO₃* | 100% |

*Procedure modified in that articles were first treated with carbon black, rather than heat-treated.

From the above table, it can be seen that the use of a sodium-containing compound is particularly effective in improving the adhesive properties of the cured coating. Significant improvements in adhesive properties have been obtained also with the use of treating solutions containing other alkali metal compounds, including lithium and potassium in the form of potassium hydroxide and lithium nitrate. It is believed that the introduction into the coating of the alkali metal ion has a stabilizing influence on the resin—possibly like the effect of Gegen ions—and this causes the resin to flow to a greater extent as it cures under the influence of heat.

The adhesion problem has been experienced also in the coating of steel Q-panels which were heat-treated before they were coated. (Such panels have a relatively low carbon content, for example, 0.08–0.13 wt. %, as in SAE No. 1008 and 1010 carbon steels.) Improvements in the adhesive properties of the cured coating formed on such steel surfaces can be realized by the use of the present invention.

The next group of examples illustrates the improvements in heat resistance of autodeposited coatings treated in accordance with the present invention.

EXAMPLE NO. 6

The test work described hereafter involved the coating of steel Q-panels. The autodepositing composition used in the test work was like the composition described in Example No. 5 above, except that the ferric fluoride content was about 2.1 g/l and the HF content was about 0.53 g/l.

The panels used in the testing were immersed in the composition for 120 seconds. Coating took place at ambient temperature and the coatings formed were about 0.57–0.58 mil in thickness. About 1 minute after the articles were withdrawn from the coating composition, they were rinsed in tap water by immersing them therein for 30 seconds, and 1 minute after completion of the water rinse, they were immersed for 1 minute in an aqueous treating solution containing about 3 g/l of NaOH. Thereafter, the coatings were cured for about 20 minutes in an oven having a temperature of about 212° F.

The heat resistance of the coated panels was evaluated by placing them in an oven having a temperature of 70° C. and periodically evaluating the coatings. The evaluation consisted of withdrawing the panels from the oven and subjecting them to an impact test according to ASTM D 2794-84. Speaking generally, the test involves impacting the coated surface with a ½" ball at a force of 160"-lbs. Thereafter, there is applied to the impacted surface a piece of 3M 610 tape which is removed and then observed to determine how much coating adhered to the tape. Selected coated panels were evaluated in this manner after 16 days, after 37 days, and after 50 days from the time they were placed in the oven. In all cases, observation showed that there was no coating loss to the tape. Salt spray evaluation of panels that were in the oven for 50 days showed excellent corrosion resistance. In contrast, a control panel was treated in exactly the same way except that it was rinsed with water instead of the aqueous solution of sodium hydroxide. Evaluation showed significant loss of coating after 16 days and also after 37 days.

The above examples illustrate improvements that can be obtained by treating autodeposited coatings with an alkaline material. The pH of an aqueous solution containing the alkaline material will in general be in excess of 7. However, it should be understood that the alkaline material can be used also in a solution that has a pH of about 7.

It has been observed that autodeposited coatings treated in accordance with the present invention are capable of being cured satisfactorily at lower temperatures than coatings that have not been so treated. It has also been observed that cured coatings formed in accordance with the present invention may contain as much as 30 to 50 wt. % more iron than coatings which have not been alkaline rinsed.

We claim:

1. In a process for forming an autodeposited coating on a metallic surface in which an uncured form of the coating is formed by contacting the metallic surface with an autodepositing composition until the coating is formed, and thereafter contact between the coated surface and the autodepositing composition is terminated, the improvement comprising thereafter contacting the uncured form of said coating with an alkaline material and thereafter curing the thus treated coating.

2. A process according to claim 1 wherein the uncured form of the coating is contacted with an aqueous alkaline solution.

3. A process according to claim 2 wherein said alkaline material is ammonium hydroxide or an alkali metal hydroxide.

4. A process according to claim 2 wherein said alkaline material is volatile under the curing conditions for said coating.

5. A process according to claim 3 wherein said alkali metal hydroxide is sodium hydroxide.

6. A process according to claim 2 wherein said solution contains about 2 to about 15 g/l of said alkaline material.

7. A process according to claim 2 wherein said autodeposited coating is formed from an autodepositing composition consisting essentially of particles of resin dispersed in an aqueous acidic solution prepared from hydrofluoric acid and ferric fluoride and wherein said resin comprises an internally stabilized vinylidene chloride copolymer or an externally stabilized vinylidene chloride copolymer containing in excess of 50 wt % of vinylidene chloride.

8. A process according to claim 6 wherein said resin is crystalline.

9. A process according to claim 7 wherein said resin is an internally stabilized vinylidene chloride copolymer.

10. A process according to claim 9 wherein said copolymer comprises vinylidene chloride and one or more monomers selected from the group consisting of vinyl chloride, acrylic acid, methacrylic acid, methylacrylate, ethylacrylate, butylacrylate, methyl methacrylate, acrylamide, methacrylamide, acrylonitrile and methacrylonitrile.

11. A process according to claim 10 wherein said copolymer is stabilized with a water-soluble copolymerizable material having the formula:

R—Z—Q—SO$_3$—M$^+$ wherein R is vinyl or alkyl substituted vinyl, Z is a difunctional linking group, Q is a divalent hydrocarbon group, and M is a cation.

12. A process according to claim 11 wherein said water-soluble copolymerizable material is sulfoethylmethacrylate.

13. A process according to claim 2 wherein said autodeposited coating is formed on a ferriferous surface.

14. In a process wherein an uncured autodeposited coating is formed on a metallic surface by contacting the surface with an autodepositing composition and thereafter withdrawing the coated surface from contact with said composition, and wherein said uncured autodeposited coating includes transient iron, the improvement comprising contacting said uncured coating after said withdrawal with a material which fixes said transient iron in said coating, and thereafter curing said coating containing said fixed transient iron.

15. A process according to claim 14 wherein said coating is formed on a ferriferous surface.

16. A cured autodeposited coating adhered to a metallic substrate having transient iron fixed therein with an alkaline material.

17. A cured autodeposited coating adhered to a metal substrate as claimed in claim 16 wherein the substrate is a ferriferous surface.

18. A cured autodeposited coating adhered to a ferriferous surface as claimed in claim 17 wherein the coating comprises a crystalline vinylidene chloride copolymer.

19. A cured autodeposited coating adhered to a ferriferous surface as claimed in claim 18 wherein said alkaline material is an alkali metal hydroxide.

20. A cured autodeposited coating adhered to a ferriferous surface as claimed in claim 18 wherein said alkaline material is anunonium bicarbonate.

21. A process according to claim 6 wherein said solution contains about 3 to about 5 g/l of said alkaline material.

22. A process according to claim 1 wherein said uncured coating is contacted with water prior to being contacted with said alkaline material.

23. In a process for forming an autodeposited coating on a tin-plated or ferriferous surface on which the cured form of the coating tends to bond poorly, and in which an uncured form of the coating is formed on said surface and thereafter cured, the improvement comprising improving the bond of the cured form of said coating to said surface by applying to the uncured coating an alkaline material, maintaining said alkaline material on said uncured coating by refraining from treating the uncured coating in a manner such that said alkaline material would be removed or rendered ineffective, and thereafter curing the uncured coating.

24. A process according to claim 23 wherein said alkaline material is an aqueous solution of an alkali metal hydroxide.

25. A process according to claim 24 wherein said alkali metal is sodium.

26. A process according to claim 25 wherein said uncured coating is treated with an aqueous solution of sodium hydroxide.

27. A process according to claim 23 wherein said alkaline material is in the form of an aqueous solution containing about 0.1 to about 15 g/l of the material and wherein the solution is substantially free of toxic chromium which causes waste disposal problems.

28. A process according to claim 1 wherein said alkaline material is effective in improving the heat-resistant properties of the cured coating.

29. A process according to claim 7 wherein said alkaline material is effective in improving the heat-resistant properties of the cured coating.

30. A process according to claim 4 wherein said alkaline material is selected from ammonium bicarbonate and ammonium hydroxide.

31. A princess according to claim 12 wherein said uncured coating is formed by immersing a ferriferous surface in said composition, and wherein the uncured coating is rinsed with water prior to contact with said alkaline material, and wherein said alkaline material is in the form of an aqueous solution containing about 0.1 to about 15 g/l of sodium hydroxide or ammonium bicarbonate, and wherein the solution is substantially free of toxic chromium which causes waste disposal problelns.

32. A process according to claim 31 wherein said aqueous solution consists essentially of about 0.1 to about 15 g/l of sodium hydroxide.

33. A process according to claim 32 wherein said aqueous solution consists essentially of about 0.1 to about 2 g/l of sodium hydroxide.

34. A process according to claim 31 wherein said aqueous solution consists essentially of about 0.1 to about 15 g/l of ammonium bicarbonate.

35. In a process for forming an autodeposited coating on a metallic surface in which an uncured form of the coating is formed by contacting the metallic surface with an autodepositing composition until the coating is formed, and thereafter contact between the coated surface and the autodepositing composition is terminated, the improvement consisting essentially of thereafter contacting the uncured form of said coating with an alkaline material and thereafter curing the thus treated coating.

36. A process according to claim 35 wherein the uncured form of the coating is contacted with an aqueous alkaline solution.

37. A process according to claim 14 wherein said improvement consists essentially of the recited steps of contacting and curing.

38. A cured autodeposited coating according to claim 16 wherein the source of the alkaline material includes a source other than the coating composition from which the coating is formed.

39. A process according to claim 23 wherein said improvement consists essentially of the recited steps of applying, maintaining, and curing.

* * * * *